(12) United States Patent
Shimizu et al.

(10) Patent No.: US 10,014,378 B2
(45) Date of Patent: Jul. 3, 2018

(54) SEMICONDUCTOR DEVICE, METHOD OF MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/430,687

(22) Filed: Feb. 13, 2017

(65) Prior Publication Data
US 2018/0083112 A1   Mar. 22, 2018

(30) Foreign Application Priority Data
Sep. 16, 2016   (JP) ................. 2016-181948

(51) Int. Cl.
| H01L 29/00 | (2006.01) |
| H01L 29/40 | (2006.01) |
| H01L 29/16 | (2006.01) |
| H01L 29/10 | (2006.01) |
| H01L 29/78 | (2006.01) |
| H01L 29/66 | (2006.01) |
| H02M 7/537 | (2006.01) |
| B60R 16/02 | (2006.01) |
| B66B 11/04 | (2006.01) |
| B61C 3/00 | (2006.01) |

(52) U.S. Cl.
CPC ........ *H01L 29/408* (2013.01); *H01L 29/1095* (2013.01); *H01L 29/1608* (2013.01); *H01L 29/66068* (2013.01); *H01L 29/7802* (2013.01); *H01L 29/7811* (2013.01); *H02M 7/537* (2013.01); *B60L 2210/42* (2013.01); *B60R 16/02* (2013.01); *B61C 3/00* (2013.01); *B66B 11/043* (2013.01)

(58) Field of Classification Search
None
See application file for complete search history.

(56) References Cited

U.S. PATENT DOCUMENTS

| 8,546,815 B2 | 10/2013 | Yano et al. |
| 9,496,365 B2 | 11/2016 | Shimizu |
| 2015/0084068 A1 | 3/2015 | Shimizu |

(Continued)

FOREIGN PATENT DOCUMENTS

| JP | 5610492 | 10/2014 |
| JP | 2015-61069 | 3/2015 |

(Continued)

*Primary Examiner* — Reema Patel
(74) *Attorney, Agent, or Firm* — Oblon, McClelland, Maier & Neustadt, L.L.P.

(57) ABSTRACT

A semiconductor device according to an embodiment includes a silicon carbide layer, an insulating layer, and a region provided between the silicon carbide layer and the insulating layer, the region including a plurality of first atoms of one element from the group consisting of nitrogen (N), phosphorus (P), arsenic (As), antimony (Sb), and bismuth (Si), at least some of the plurality of first atoms being four-fold coordinated atoms and/or five-fold coordinated atoms.

17 Claims, 14 Drawing Sheets

(56) References Cited

U.S. PATENT DOCUMENTS

| | | | |
|---|---|---|---|
| 2015/0303271 A1* | 10/2015 | Tanaka | H01L 29/78 257/77 |
| 2017/0345657 A1 | 11/2017 | Shimizu et al. | |
| 2017/0345903 A1 | 11/2017 | Shimizu | |

FOREIGN PATENT DOCUMENTS

| | | |
|---|---|---|
| JP | 2017-216305 A | 12/2017 |
| JP | 2017-216306 A | 12/2017 |

* cited by examiner

GATE INSULATING LAYER

INTERFACE REGION

SILICON CARBIDE LAYER

O
Si
C 90 140 90    150    90 140 90

90    150 140    90

SEMICONDUCTOR DEVICE, METHOD OF MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2016-181948, filed on Sep. 16, 2016, the entire contents of which are incorporated herein by reference.

FIELD

Embodiments described herein relate generally to a semiconductor device, a method of manufacturing a semiconductor device, an inverter circuit, a driving device, a vehicle, and an elevator.

BACKGROUND

Silicon carbide (SiC) is expected to be used as a material for a next-general semiconductor device. SiC has better physical properties than silicon (Si). For example, SiC has a bandgap that is three times wider than that of Si, a breakdown field strength that is about ten times higher than that of Si, and a thermal conductivity that is about three times higher than that of Si. These characteristics can be used to achieve a semiconductor device which has low loss and can operate at a high temperature.

However, for example, when silicon carbide is used to form a metal oxide semiconductor field effect transistor (MOSFET), there is the problem that the mobility of carriers is reduced. It is considered that the mobility of carriers is reduced by the influence of an interface state between a silicon carbide layer and a gate insulating layer.

As a method for reducing the interface state, there is a method that terminates the surface of the silicon carbide layer with a termination element.

DETAILED DESCRIPTION

Figure 1:
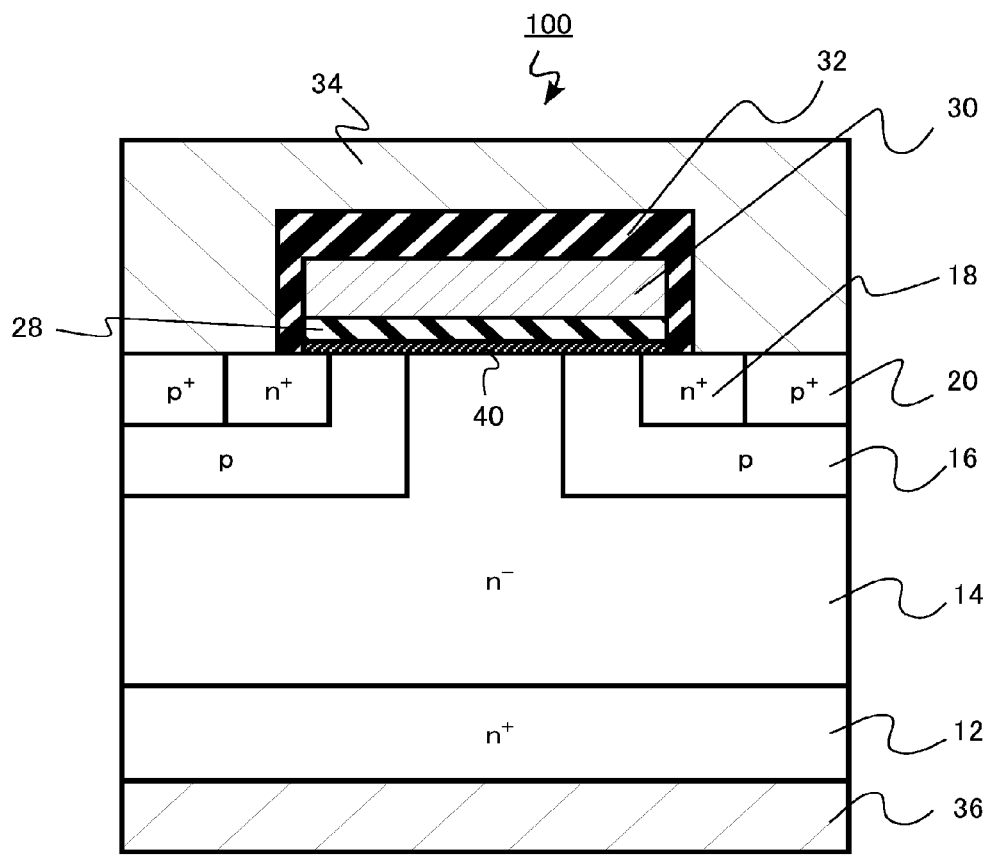
FIG. 1 is a cross-sectional view schematically illustrating a semiconductor device according to a first embodiment.

A semiconductor device according to an embodiment includes a silicon carbide layer, an insulating layer; and a region provided between the silicon carbide layer and the insulating layer, the region including a plurality of first atoms of one element from the group consisting of nitrogen (N), phosphorus (P), arsenic (As), antimony (Sb), and bismuth (Bi), at least some of the plurality of first atoms being four-fold coordinated atoms and/or five-fold coordinated atoms.

Hereinafter, embodiments of the invention will be described with reference to the drawings. In the following description, the same members or similar members are denoted by the same reference numerals and the description thereof will not be repeated.

In the specification, "coordination" means that atoms around one central atom are chemically bonded to the central atom. The number of atoms bonded to the central atom is a coordination number. When atoms are at a distance corresponding to a diameter of a central atom from the surface of the central atom in a radial direction, it can be estimated that the central atom is chemically bonded to other atoms. For example, a value that is two times greater than the van der Waal's radius is used as the distance corresponding to the diameter of the central atom.

In the following description, $n^+$, $n$, $n^-$, $p^+$, $p$, and $p^-$ indicate the relative levels of impurity concentration in each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply referred to as an n type and a $p^+$ type and a $p^-$ type are simply referred to as a p type.

First Embodiment

A semiconductor device according to this embodiment includes a silicon carbide layer, an insulating layer, and a region that is provided between the silicon carbide layer and the insulating layer and includes a plurality of first atoms of one element selected from the group consisting of nitrogen (N), phosphorus (P), arsenic (As), antimony (Sb), and bismuth (Bi). At least some of the plurality of first atoms are four-fold coordinated and/or five-fold coordinated atoms. The region includes the plurality of second atoms of one element selected from the group consisting of oxygen (O), sulfur (S), selenium (Se), tellurium (Te), hydrogen (H), and fluorine (F).

FIG. 1 is a cross-sectional view schematically illustrating a MOSFET which is the semiconductor device according to this embodiment. A MOSFET 100 is a double implantation MOSFET (DIMOSFET) in which a p well and a source region are formed by ion implantation. In addition, the MOSFET 100 is an n-channel MOSFET having electrons as carriers.

The MOSFET 100 includes a silicon carbide substrate 12, a drift layer (silicon carbide layer) 14, a p well region (silicon carbide layer) 16, a source region 18, a well contact region 20, an interface region (region) 40, a gate insulating layer (insulating layer) 28, a gate electrode 30, an interlayer insulating film 32, a source electrode 34, and a drain electrode 36.

The silicon carbide substrate 12 is, for example, an n⁺ 4H-SiC substrate. The silicon carbide substrate 12 has, for example, nitrogen (N) as n-type impurities. The n-type impurity concentration of the silicon carbide substrate 12 is, for example, equal to or greater than $1 \times 10^{18}$ cm$^{-3}$ and equal to or less than $1 \times 10^{2}$ cm$^{-3}$.

For example, the front surface of the silicon carbide substrate 12 is inclined at an angle that is equal to or greater than 0 degrees and equal to or less than 8 degrees with respect to a (0001) face. The (0001) face is referred to as a silicon face. In the silicon face, atoms in the outermost surface are silicon atoms. The silicon atom in the outermost surface is three-fold coordinated to carbon atoms immediately below the outermost surface.

For example, the rear surface of the silicon carbide substrate 12 is inclined at an angle that is equal to or greater than 0 degrees and equal to or less than 8 degrees with respect to a (000-1) face. The (000-1) face is referred to as a carbon face. In the carbon face, atoms in the outermost surface are carbon atoms. The carbon atom in the outermost surface is three-fold coordinated to silicon atoms immediately below the outermost surface.

The drift layer 14 is provided on the front surface of the silicon carbide substrate 12. The drift layer 14 is an n⁻ silicon carbide layer. The drift layer 14 includes, for example, nitrogen as n-type impurities.

The n-type impurity concentration of the drift layer 14 is, for example, equal to or greater than $5 \times 10^{15}$ cm$^{-3}$ and equal to or less than $2 \times 10^{16}$ cm$^{-3}$. The drift layer 14 is, for example, a SiC epitaxial growth layer that is formed on the silicon carbide substrate 12 by epitaxial growth. The drift layer 14 is made of, for example, 4H-SiC and the surface thereof is inclined at an angle that is equal to or greater than 0 degrees and equal to or less than 8 degrees with respect to the (0001) face.

A surface of the drift layer 14 is also inclined at an angle that is equal to or greater than 0 degrees and equal to or less than 8 degrees with respect to the silicon face. The thickness of the drift layer 14 is, for example, equal to or greater than 5 μm and equal to or less than 100 μm.

The p well region 16 is provided in a portion of the surface of the drift layer 14. The p well region 16 is a p-type silicon carbide region. The p well region 16 includes, for example, aluminum (Al) as p-type impurities. The p-type impurity concentration of the p well region 16 is, for example, equal to or greater than $5 \times 10^{15}$ cm$^{-3}$ and equal to or less than $1 \times 10^{17}$ cm$^{-3}$.

The depth of the p well region 16 is, for example, equal to or greater than 0.4 μm and equal to or less than 0.8 μm. The p well region 16 functions as a channel region of the MOSFET 100.

A surface of the p well region 16 is also inclined at an angle that is equal to or greater than 0 degrees and equal to or less than 8 degrees with respect to the silicon face.

The source region 18 is provided in a portion of the surface of the p well region 16. The source region 18 is an n⁺ silicon carbide layer. The source region 18 includes, for example, phosphorus (P) as n-type impurities. The n-type impurity concentration of the source region 18 is, for example, equal to or greater than $1 \times 10^{18}$ cm$^{-3}$ and equal to or less than $1 \times 10^{22}$ cm$^{-3}$.

The depth of the source region 18 is less than the depth of the p well region 16. The depth of the source region 18 is, for example, equal to or greater than 0.2 μm and equal to or less than 0.4 μm.

The well contact region 20 is provided in a portion of the surface of the p well region 16. The well contact region 20 is provided on the side of the source region 18. The well contact region 20 is a p⁺ silicon carbide region.

The well contact region 20 includes, for example, aluminum as p-type impurities. The p-type impurity concentration of the well contact region 20 is, for example, equal to or greater than $1 \times 10^{18}$ cm$^{-3}$ and equal to or less than $1 \times 10^{22}$ cm$^{-3}$.

The depth of the well contact region 20 is less than the depth of the p well region 16. The depth of the well contact region 20 is, for example, equal to or greater than 0.2 μm and equal to or less than 0.4 μm.

The gate insulating layer 28 is provided between the p well region 16 and the gate electrode 30. The gate insulating layer 28 is continuously formed on the surface of the drift layer 14 and the p well region 16.

The thickness of the gate insulating layer 28 is, for example, equal to or greater than 30 nm and equal to or less than 60 nm. The gate insulating layer 28 functions as a gate insulating layer of the MOSFET 100.

The interface region 40 is provided between the drift layer 14 and the gate insulating layer 28 and between the p well region 16 and the gate insulating layer 28. The interface region 40 includes first atoms of one element selected from the group consisting of nitrogen (N), phosphorus (P), arsenic (As), antimony (Sb), and bismuth (Bi). The interface region 40 may include, as the first atoms, two or more kinds of elements among them.

The interface region 40 includes second atoms of one element selected from the group consisting of oxygen (O), sulfur (S), selenium (Se), and tellurium (Te). The second atom is chemically bonded to the first atom. The interface region 40 may include, as the second atoms, two or more kinds of elements among them.

An element including both the first atom and the second atom bonded to the first atom is referred to as a termination element. The termination element substitutes a silicon atom or a carbon atom in the uppermost layer of the drift layer 14 and the p well region 16. For example, in the case of the silicon face, the termination element may substitutes a silicon atom. In the case of the carbon face, the termination element may substitutes a carbon atom. Hereinafter, an example in which the first atom is phosphorus (P) will be described. In addition, an example in which the second atom is oxygen (O) will be described.

Figure 2:
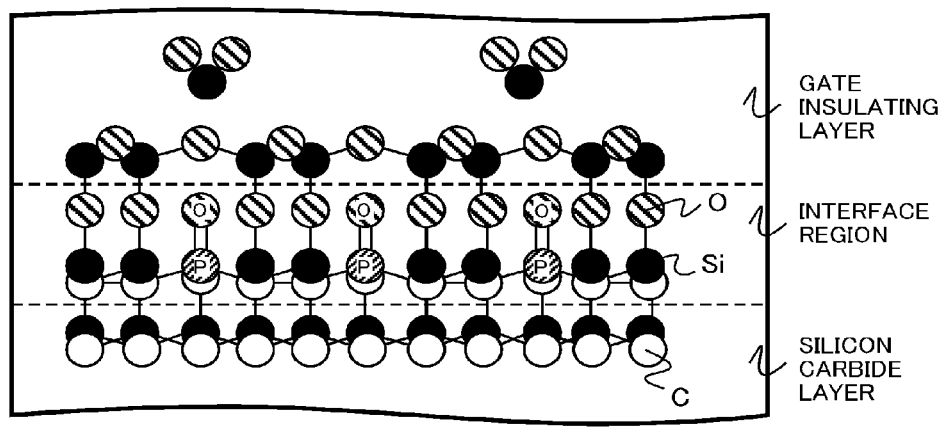
FIG. 2 is an enlarged cross-sectional view illustrating a portion of the semiconductor device according to the first embodiment.

FIG. 2 is an enlarged cross-sectional view schematically illustrating a portion of the semiconductor device according to this embodiment. FIG. 2 is an enlarged view illustrating a region including the interface region 40.

In the interface region 40, a phosphorus atom substitutes a silicon atom in the uppermost layer of the drift layer 14 and the p well region 16. In addition, the phosphorus atom forms a double bond with an oxygen atom. The phosphorus atom is chemically bonded to three carbon atoms and one oxygen atom.

Therefore, the phosphorus atom which substitutes the silicon atom is four-fold coordinated. In other words, the coordination number of the phosphorus atom which substitutes the silicon atom is 4.

Figure 3:
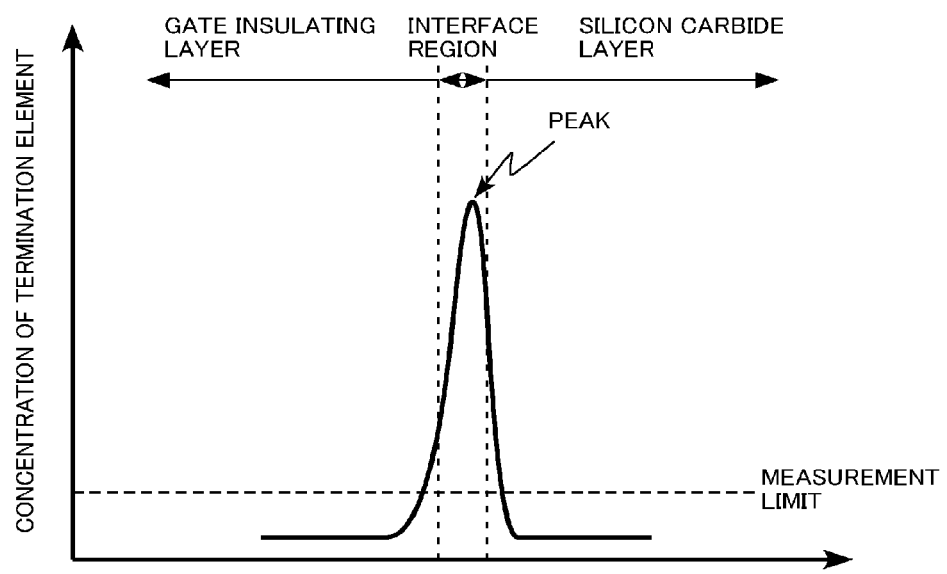
FIG. 3 is a diagram illustrating a concentration distribution of a termination element according to the first embodiment.

FIG. 3 is a diagram illustrating the concentration distribution of the termination element according to this embodiment.

The termination element is segregated at the interface between the drift layer 14 and the gate insulating layer 28 and the interface between the p well region 16 and the gate insulating layer 28. The peak of the concentration distribution of the termination element is located in the interface region 40. The concentration distribution of the termination element may be a so-called delta distribution.

The full width at half maximum of the peak of the concentration distribution of the termination element is, for example, equal to or less than 2 nm. In addition, the full width at half maximum of the peak of the concentration distribution of the termination element is, for example, equal to or less than 1 nm. Furthermore, the full width at half maximum of the peak of the concentration distribution of the termination element is, for example, equal to or less than 0.50 nm. The full width at half maximum of the peak of the concentration distribution of the termination element is, for example, equal to or less than 0.25 nm.

The peak of the concentration distribution of the termination element in the interface region 40 is, for example, equal to or greater than $1 \times 10^{18}$ cm$^{-3}$ and equal to or less than $1 \times 10^{2}$ cm$^{-3}$. In addition, the peak of the concentration distribution of the termination element is, for example, equal to or greater than $5 \times 10^{18}$ cm$^{-3}$ and equal to or less than $5 \times 10^{19}$.

The first atom forming the termination element is segregated at the interface between the drift layer 14 and the gate insulating layer 28 and the interface between the p well region 16 and the gate insulating layer 28. The peak (first peak) of the concentration distribution of the first atom is located in the interface region 40.

The full width at half maximum of the peak of the concentration distribution of the first atom is, for example, equal to or less than 2 nm. In addition, the full width at half maximum of the peak of the concentration distribution of the first atom is, for example, equal to or less than 1 nm. Furthermore, the full width at half maximum of the peak of the concentration distribution of the first atom is, for example, equal to or less than 0.50 nm. The full width at half maximum of the peak of the concentration distribution of the first atom is, for example, equal to or less than 0.25 nm.

The peak of the concentration distribution of the first atom in the interface region 40 is, for example, equal to or greater than $1 \times 10^{18}$ cm$^{-3}$ and equal to or less than $1 \times 10^{20}$ cm$^{-3}$. In addition, the peak of the concentration distribution of the first atom is, for example, equal to or greater than $5 \times 10^{18}$ cm$^{-3}$ and equal to or less than $5 \times 10^{19}$ cm$^{-3}$.

Similarly, the second atom forming the termination element is segregated at the interface between the drift layer 14 and the gate insulating layer 28 and the interface between the p well region 16 and the gate insulating layer 28. The peak (second peak) of the concentration distribution of the second atom is located in the interface region 40.

The full width at half maximum of the peak of the concentration distribution of the second atom is, for example, equal to or less than 2 nm. In addition, the full width at half maximum of the peak of the concentration distribution of the second atom is, for example, equal to or less than 1 nm. Furthermore, the full width at half maximum of the peak of the concentration distribution of the second atom is, for example, equal to or less than 0.50 nm. The full width at half maximum of the peak of the concentration distribution of the second atom is, for example, equal to or less than 0.25 nm.

The peak of the concentration distribution of the second atom in the interface region 40 is, for example, equal to or greater than $1 \times 10^{18}$ cm$^{-3}$ and equal to or less than $1 \times 10^{20}$ cm$^{-3}$. In addition, the peak of the concentration distribution of the second atom is, for example, equal to or greater than $2 \times 10^{18}$ cm$^{-3}$ and equal to or less than $5 \times 10^{19}$ cm$^{-3}$.

The kind of termination element included in the interface region 40 can be measured by, for example, secondary ion mass spectroscopy (SIMS).

The concentration and distribution of the termination element in the interface region 40 can be measured by, for example, secondary ion mass spectroscopy (SIMS).

The four-fold coordination of the first atom forming the termination element can be identified by, for example, X-ray photoelectron spectroscopy (XPS). In addition, for example, the arrangement of atoms can be directly observed by a combination of scanning transmission electron microscopy (STEM) and energy dispersive X-ray spectroscopy (EDX) to identify the atoms. For example, the arrangement of atoms can be directly observed by a combination of STEM and electron energy loss spectroscopy (EELS) to identify the atoms.

A four-fold coordination structure in which the first atom is substituted with an element in the outermost surface of the silicon carbide layer and the second atom is bonded to the first atom can be specified by RAMAN vibration mode analysis or FTIR vibration mode analysis.

The coordination number or the electron state of each of the first atom and the second atom can be identified by the measurement of core level shift in XPS.

The concentration of the termination element at a position that is at a distance of 1 nm or more from the peak of the concentration distribution of the termination element is, for example, equal to or less than $5 \times 10^{17}$ cm$^{-3}$. The concentration of the first atom at a position that is at a distance of 1 nm or more from the peak of the concentration distribution of the first atom is, for example, equal to or less than $5 \times 10^{17}$ cm$^{-3}$. The concentration of the termination element or the first atom in the gate insulating layer 28 and the silicon carbide layer is, for example, equal to or less than the measurement limit of SIMS. The measurement limit of SIMS is, for example, $2 \times 10^{16}$ cm$^{-3}$.

The gate insulating layer 28 is provided between the p well region 16 and the gate electrode 30. The gate insulating layer 28 is continuously formed on the surface of the drift layer 14 and the p well region 16.

The gate insulating layer 28 is made of, for example, silicon oxide. The thickness of the gate insulating layer 28 is, for example, equal to or greater than 30 nm and equal to or less than 60 nm.

The gate electrode 30 is provided on the gate insulating layer 28. The gate insulating layer 28 is provided between the gate electrode 30 and the interface region 40.

For example, polysilicon including n-type impurities or p-type impurities can be applied to the gate electrode 30.

The interlayer insulating film 32 is formed on the gate electrode 30. The interlayer insulating film 32 is, for example, a silicon oxide film.

The source electrode 34 is electrically connected to the source region 18 and the well contact region 20. The source electrode 34 also functions as a p well electrode that applies potential to the p well region 16.

The source electrode 34 has, for example, a stacked structure of a nickel (Ni) barrier metal layer and an aluminum metal layer provided on the barrier metal layer. The nickel barrier metal layer and the silicon carbide layer may react with each other to form nickel silicide (for example, NiSi or $Ni_2Si$). An alloy may be formed by the reaction between the nickel barrier metal layer and the aluminum metal layer.

The drain electrode 36 is formed on a surface of the silicon carbide substrate 12 opposite to the drift layer 14, that is, on the rear surface of the silicon carbide substrate 12. The drain electrode 36 is made of, for example, nickel. Nickel may react with the silicon carbide substrate 12 to form nickel silicide (for example, NiSi or $Ni_2Si$).

In this embodiment, the n-type impurities are, for example, nitrogen or phosphorus. Arsenic (As) or antimony (Sb) may be applied as the n-type impurities.

In this embodiment, the p-type impurities are, for example, aluminum. Boron (B), gallium (Ga), or indium (In) may be applied as the p-type impurities.

Next, the function and effect of this embodiment will be described.

When a MOSFET is formed using silicon carbide, there is the problem that the mobility of carrier is reduced. It is considered that a surface state between the silicon carbide layer and the gate insulating layer or a level (state) in the gate insulating layer causes a reduction in the mobility of carriers.

In this embodiment, since the termination element including the first atom and the second atom is provided, a level in the bandgap of the silicon carbide is removed. In addition, since the mass of the termination element is large, the phonon scattering of the carriers is less likely to occur. Therefore, the mobility of the carriers is improved. In addition, the termination element in which the first atom and the second atom are bonded to each other is more energetically stable than a termination element of a single atom. As a result, it is possible to achieve stable interface termination.

Next, the function and effect of this embodiment will be described in detail.

Figure 4A:
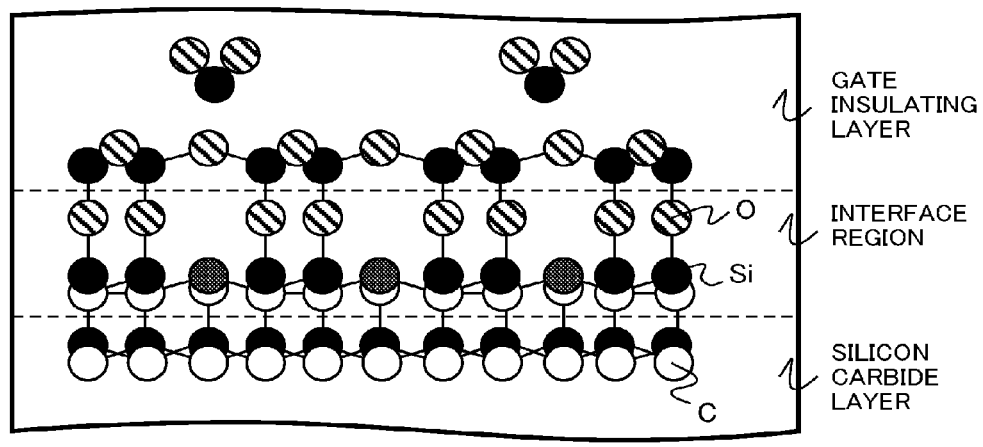
FIGS. 4A and 4B are diagrams illustrating the function and effect of the first embodiment.
Figure 4B:
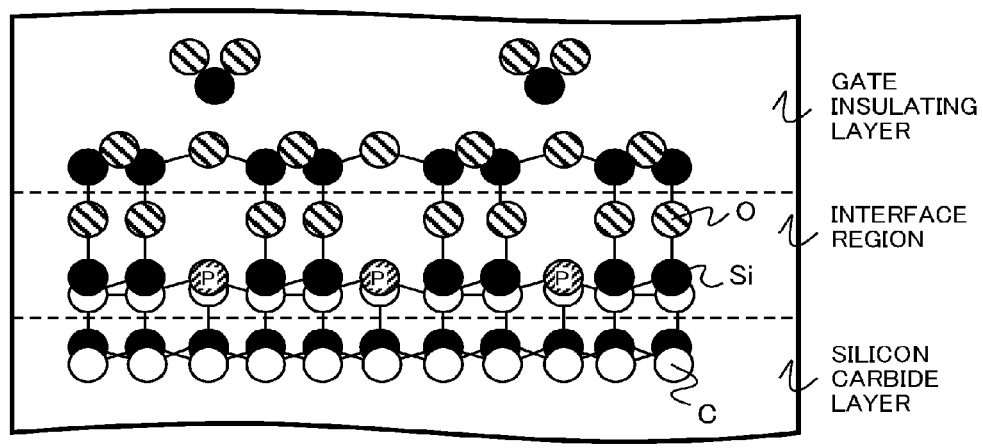

FIGS. 4A, 4B, 5A, 5B, 5C, 6A, 6B, and 6C are diagrams illustrating the function and effect of this embodiment. FIGS. 4A and 4B are enlarged cross-sectional views schematically illustrating a region including the interface region. FIG. 4A is a diagram illustrating a case in which no termination elements are present in the interface region. FIG. 4B is a diagram illustrating a case in which only a phosphorus atom is present as the termination element in the interface region.

Figure 5A:
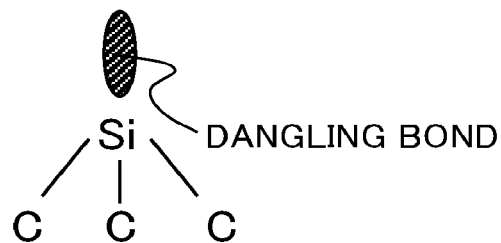
FIGS. 5A, 5B, and 5C are diagrams illustrating the function and effect of the first embodiment.
Figure 5B:
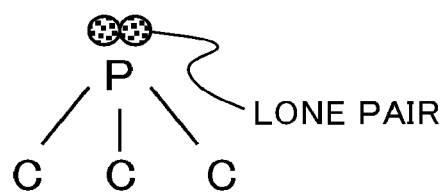
Figure 5C:
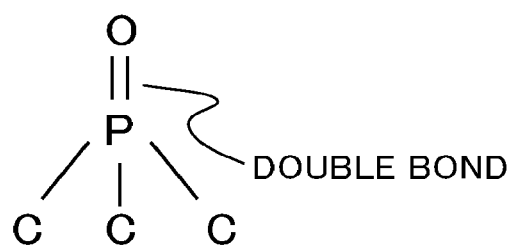

FIGS. 5A, 5B, and 5C are diagram schematically illustrating the structure of the outermost surface of the silicon carbide layer. FIG. 5A is a diagram illustrating a case in which there is no termination element in the interface region. FIG. 5B is a diagram illustrating a case in which only a phosphorus atom is present as the termination element. FIG. 5C is a diagram illustrating a case in which a phosphorus atom and an oxygen atom form the termination element.

Figure 6A:
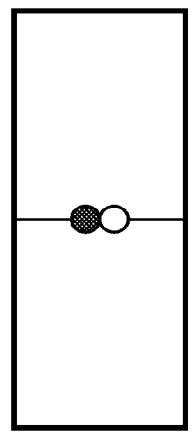
FIGS. 6A, 6B, and 6C are diagrams illustrating the function and effect of the first embodiment.
Figure 6B:
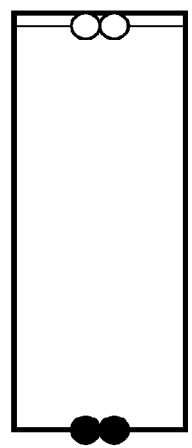
Figure 6C:
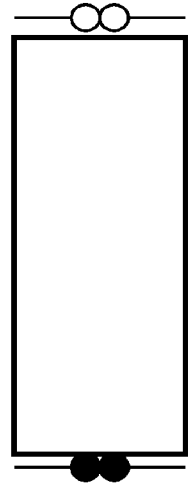

FIGS. 6A, 6B, and 6C are diagrams schematically illustrating the band structure of the outermost surface of the silicon carbide layer. FIGS. 6A, 6B, and 6C illustrate the results based on first principle calculation. FIG. 6A is a diagram illustrating a case in which no termination elements are present in the interface region. FIG. 6B is a diagram illustrating a case in which only a phosphorus atom is the termination element. FIG. 6C is a diagram illustrating a case in which a phosphorus atom and an oxygen atom form the termination element. In FIGS. 6A, 6B, and 6C, a black circle indicates a level that is filled with an electron and a white circle indicates an empty level.

For example, when there is no termination element in the interface region as illustrated in FIGS. 4A and FIG. 5A, a dangling bond is present in the outermost surface of the silicon carbide layer. As illustrated in FIG. 6A, a level is formed in the bandgap of the silicon carbide layer by the dangling bond.

For example, it is considered that an electron moving through a channel is trapped at the level in the bandgap of the silicon carbide layer, which results in a reduction in the mobility of carriers in the MOSFET.

For example, when a phosphorus atom is present as the termination element in the interface region as illustrated in FIGS. 4B and 5B, a dangling bond in the outermost surface of the silicon carbide layer is removed. In this case, the phosphorus atom is chemically bonded to three carbon atoms. The phosphorus atom is three-fold coordinated. In other words, the coordination number of the phosphorus atom is 3. However, as illustrated in FIG. 6B, a level remains in the vicinity of the lower end of the conduction band in the bandgap of the silicon carbide layer. An electron is trapped at the level in the bandgap. As a result, there is a concern that the mobility of carriers in the MOSFET will be reduced.

When only the phosphorus atom is present as the termination element, the phosphorus atom has an lone pair as illustrated in FIG. 5B. There is a concern that the characteristics of the MOSFET will deteriorate due to the interaction between the lone pair and a neighboring atom. In particular, there is a concern that a barrier to an electron will be lowered by the lone pair and the reliability of the gate insulating layer will be reduced.

In the MOSFET 100 according to this embodiment, as illustrated in FIG. 5C, a phosphorus atom and an oxygen atom that forms a double bond with the phosphorus atom form the termination element. As illustrated in FIG. 6C, the level in the bandgap of the silicon carbide layer is completely removed. Therefore, no electrons are trapped and the mobility of carriers in the MOSFET is improved.

Since the oxygen atom is bonded to the phosphorus atom, the mass of the termination element is greater than that when only the phosphorus atom is present as the termination element. Therefore, the phonon excitation of the termination element is less likely to occur due to the electron moving through the channel. In other words, the phonon scattering of the electron moving through the channel is less likely to occur. As a result, the mobility of carriers in the MOSFET is improved.

When a phosphorus atom and an oxygen atom form the termination element, the structure is more energetically stable than that when only the phosphorus atom is present as the termination element. Therefore, for example, the separation of the termination element from the interface region 40 is less likely to occur. As a result, stable interface termination is achieved. The reliability of the MOSFET is improved.

In this embodiment, an example in which the element including the first atom is phosphorus (P) has been described. However, the element including the first atom may be nitrogen (N), arsenic (As), antimony (Sb), or bismuth (Bi). In this case, the same function and effect as described above are obtained.

It is preferable to apply arsenic (As), antimony (Sb), or bismuth (Bi) with large mass in order to increase the mass of the termination element and to prevent the phonon scattering of electrons.

In addition, an example in which the element including the second atom is oxygen (O) has been described. However, the element including the second atom may be sulfur (S), selenium (Se), or tellurium (Te). In this case, the same function and effect as described above are obtained.

It is preferable to apply sulfur (S), selenium (Se), or tellurium (Te) with large mass in order to increase the mass of the termination element and to prevent the phonon scattering of electrons.

It is preferable that the number of four-fold coordinated first atoms be greater than the number of three-fold coordinated first atoms in the interface region 40, in order to improve the mobility of carriers in the MOSFET 100 and to improve the reliability of the MOSFET 100.

The intensity of the peak caused by four-fold coordination can be compared with the intensity of the peak caused by three-fold coordination by, for example, XPS to determine whether the number of four-fold coordinated first atoms is greater than the number of three-fold coordinated first atoms. In addition, the arrangement of atoms is directly observed by a combination of STEM and EDX or a combination of STEM and EELS to compare the number of four-fold coordinated first atoms with the number of three-fold coordinated first atoms in a unit area, thereby performing the determination.

The three-fold coordinated first atom may be present in the interface region 40 or may not be present in the interface region 40.

The number of four-fold coordinated first atoms in the interface region 40 is preferably 90% or more of the number of first atoms in the interface region 40 and is more preferably 95% or more of the number of first atoms, in order to improve the mobility of carriers in the MOSFET 100 and to improve the reliability of the MOSFET 100. In other words, a ratio of the number of four-fold coordinated first atoms to the number of the first atoms is preferably 90% or more, and more preferably 95% or more of the number.

The intensity of the peak caused by four-fold coordination can be compared with the intensity of the peak caused by other coordinations by, for example, XPS to determine the ratio of the number of four-fold coordinated first atoms in the interface region 40 to the number of first atoms in the interface region 40. In addition, the arrangement of atoms is directly observed by a combination of STEM and EDX or a combination of STEM and EELS to compare the number of four-fold coordinated first atoms with the number of first atoms having the other coordination numbers in a unit area, thereby performing the ratio.

When there are a large number of first atoms in the p well region 16, there is a concern that the threshold voltage of the MOSFET will vary. In addition, when there are a large number of first atoms in the gate insulating layer 28, there is a concern that the threshold voltage of the MOSFET will be changed by positive fixed charge.

Therefore, it is preferable that, in the concentration distribution of the first atoms, that is, the concentration distribution of the termination elements, the concentration be biased to the interface region, as illustrated in FIG. 3.

Therefore, the full width at half maximum of the peak of the concentration distribution of the termination element is preferably equal to or less than 2 nm, more preferably equal to or less than 1 nm, furthermore preferably equal to or less than 0.50 nm, and most preferably equal to or less than 0.25 nm.

It is preferable that the peak of the concentration distribution of the termination elements be equal to or greater than $1 \times 10^{18}$ cm$^{-3}$ and equal to or less than $1 \times 10^{10}$ cm$^{-3}$. When the peak is less than the above-mentioned range, there is a concern that the mobility of carriers in the MOSFET 100 will not be sufficiently improved. When the peak is greater than the above-mentioned range, it is difficult to manufacture the MOSFET 100. The peak of the concentration distribution of the termination elements is more preferably equal to or greater than $2 \times 10^{18}$ cm$^{-3}$ and equal to or less than $5 \times 10^{19}$ cm$^{-3}$.

In this embodiment, an example in which the gate insulating layer 28 is made of silicon oxide has been described. However, the gate insulating layer 28 may be made of an insulating material other than silicon oxide. For example, the gate insulating layer 28 may be made of silicon oxynitride, silicon nitride, hafnium oxide, hafnium oxynitride, hafnium oxide silicate, hafnium oxynitride silicate, zirconium oxide, zirconium oxynitride, zirconium oxide silicate, zirconium oxynitride silicate, aluminum oxide, or aluminum oxynitride. The gate insulating layer 28 may be a stacked structure of silicon oxide and the above-mentioned insulating material.

As described above, according to this embodiment, the mobility of carriers in the MOSFET 100 is improved. In addition, stable interface termination is achieved and the reliability of the MOSFET 100 is improved.

Second Embodiment

A semiconductor device according to this embodiment includes a silicon carbide layer, an insulating layer, and a region that is provided between the silicon carbide layer and the insulating layer and includes a plurality of first atoms of one element selected from the group consisting of nitrogen (N), phosphorus (P), arsenic (As), antimony (Sb), and bismuth (Bi). At least some of the plurality of first atoms are five-fold coordinated. The region includes at least one of a plurality of second atoms of one element selected from the group consisting of hydrogen (H) and fluorine (F), a plurality of deuterium (D) atoms, and a plurality of hydroxyl groups (OH).

The semiconductor device according to this embodiment differs from the semiconductor device according to the first embodiment in that the first atom is not four-fold coordinated, but is five-fold coordinated. Hereinafter, the description of the same content as that in the first embodiment will not be repeated.

In the specification, since deuterium (D) is one of the isotopes of hydrogen (H) as an element, it is not treated as one kind of second atom, but is treated as an example of the hydroxyl group (OH).

Next, an example in which the element including the first atom is phosphorus (P) and the second atom is a hydrogen (H) atom will be described.

Figure 7:
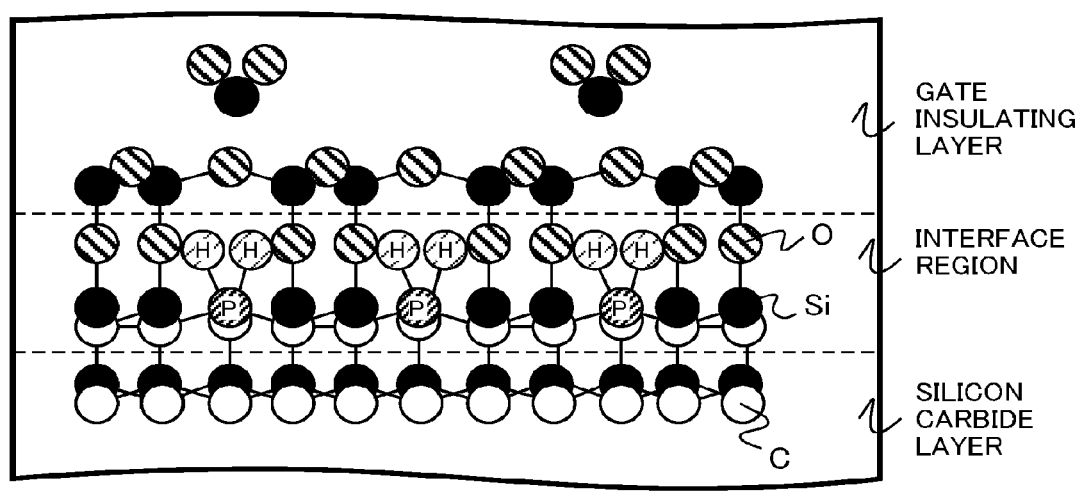
FIG. 7 is an enlarged cross-sectional view illustrating a portion of a semiconductor device according to a second embodiment.

FIG. 7 is an enlarged cross-sectional view schematically illustrating a portion of the semiconductor device according to this embodiment. FIG. 7 is an enlarged view illustrating a region including the interface region 40.

In the interface region 40, a phosphorus atom substitutes a silicon atom in the uppermost layer of the drift layer 14 and the p well region 16. In addition, the phosphorus atom is bonded to two hydrogen atoms. The phosphorus atom is chemically bonded to three carbon atoms and two hydrogen atoms.

Therefore, the phosphorus atom that substitutes the silicon atom is five-fold coordinated. In other words, the coordination number of the phosphorus atom that substitutes the silicon atom is 5.

Figure 8:
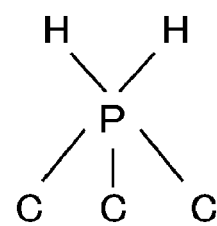
FIG. 8 is a diagram schematically illustrating the structure of a surface of a silicon carbide layer according to the second embodiment.

FIG. 8 is a diagram schematically illustrating the structure of the outermost surface of the silicon carbide layer. In the MOSFET according to this embodiment, as illustrated in FIG. 8, a phosphorus atom and two hydrogen atoms bonded to the phosphorus atom form a termination element.

In this embodiment, as illustrated in FIG. 6C, a level in the bandgap of the silicon carbide layer is completely removed. Therefore, no electrons are trapped and the mobility of carriers in the MOSFET is improved.

In this embodiment, similarly to the first embodiment, it is preferable that the concentration of the termination element be biased to the interface region as illustrated in FIG. 3.

In this embodiment, similarly to the first embodiment, it is preferable that the number of five-fold coordinated first atoms be greater than the number of three-fold coordinated first atoms in the interface region 40, in order to improve the mobility of carriers in the MOSFET and the reliability of the MOSFET.

The three-fold coordinated first atoms may be present in the interface region 40 or may not be present in the interface region 40.

The number of five-fold coordinated first atoms in the interface region 40 is preferably 90% or more of the number of first atoms in the interface region 40 and is more preferably 95% or more of the number of first atoms, in order to improve the mobility of carriers in the MOSFET 100 and the reliability of the MOSFET 100.

In addition, deuterium (D) is one of the isotopes of hydrogen (H) as an element and has a larger mass than hydrogen (H). Therefore, when deuterium (D) is bonded as the termination element, the phonon excitation of the termination element is less likely to occur due to the electron moving through a channel than that when hydrogen (H) is bonded as the termination element. As a result, the mobility of carriers in the MOSFET is improved.

According to this embodiment, the mobility of carriers in the MOSFET is improved by the same function and effect as those in the first embodiment. In addition, stable interface termination is achieved by the same function and effect as those in the first embodiment and the reliability of the MOSFET is improved.

Third Embodiment

A semiconductor device manufacturing method according to this embodiment includes, irradiating a silicon carbide layer with ultraviolet rays while supplying a plurality of first atoms of one element selected from the group consisting of nitrogen (N), phosphorus (P), arsenic (As), antimony (Sb) and bismuth (Bi) and a plurality of second atoms of one element selected from the group consisting of oxygen (O), sulfur (S), selenium (Se), tellurium (Te), hydrogen (H), and fluorine (F) to form a silicon oxide film on the silicon carbide layer.

The manufacturing method according to this embodiment is a method for manufacturing the MOSFET 100 according to the first embodiment.

Figure 9:
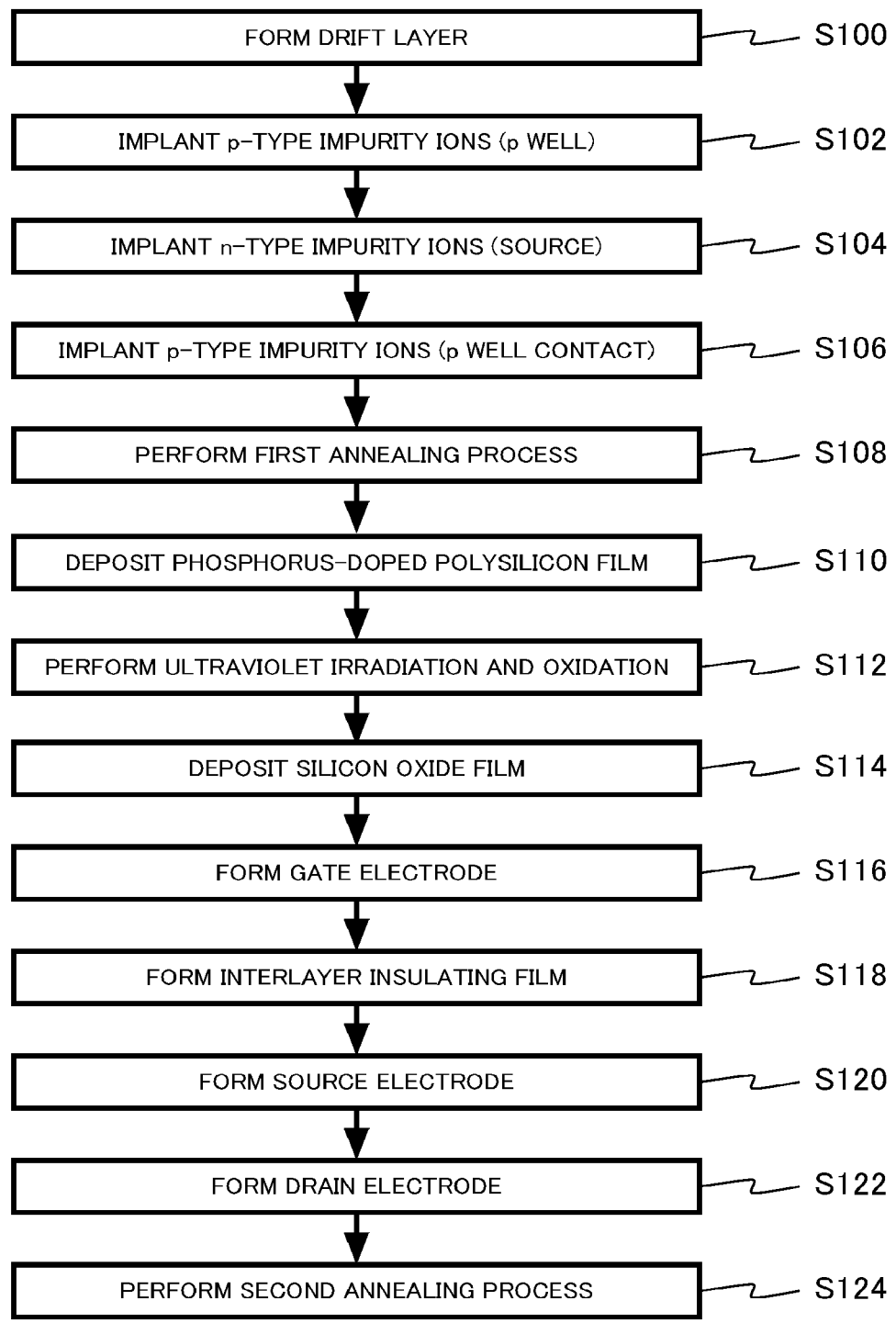
FIG. 9 is a process flowchart illustrating a semiconductor device manufacturing method according to a third embodiment.

FIG. 9 is a process flowchart illustrating the semiconductor device manufacturing method according to this embodiment.

As illustrated in FIG. 9, the semiconductor device manufacturing method includes adrift layer forming step (Step S100), a p-type impurity ion implantation step (Step S102), an n-type impurity ion implantation step (Step S104), a p-type impurity ion implantation step (Step S106), a first annealing step (Step S108), a phosphorus-doped polysilicon film forming step (Step S110), an ultraviolet irradiation and oxidation step (Step S112), a silicon oxide film deposition step (Step S114), a gate electrode forming step (Step S116), an interlayer insulating film forming step (Step S118), a source electrode forming step (Step S120), a drain electrode forming step (Step S122), and a second annealing step (Step S124).

First, the silicon carbide substrate 12 is prepared. The silicon carbide substrate 12 is made of, for example, 4H-SiC. The silicon carbide substrate 12 is, for example, a silicon carbide wafer W.

The silicon carbide substrate 12 includes nitrogen as n-type impurities. The n-type impurity concentration of the silicon carbide substrate 12 is, for example, equal to or greater than $1 \times 10^{18}$ cm$^{-3}$ and equal to or less than $1 \times 10^{20}$ cm$^{-3}$. The thickness of the silicon carbide substrate 12 is, for example, 350 The silicon carbide substrate 12 may be thinned to about 90 μm before the drain electrode is formed on the rear surface of the silicon carbide substrate 12.

In Step S100, the drift layer 14 is formed on the silicon face of the silicon carbide substrate 12 by an epitaxial growth method. The drift layer 14 is made of 4H-SiC.

The drift layer 14 includes nitrogen as n-type impurities. The n-type impurity concentration of the drift layer 14 is, for example, equal to or greater than $5 \times 10^{15}$ cm$^{-3}$ and equal to or less than $2 \times 10^{16}$ cm$^{-3}$. The thickness of the drift layer 14 is, for example, equal to or greater than 5 μm and equal to or less than 100 μm.

In Step S102, first, a first mask member is formed by patterning using photolithography and etching. Then, aluminum ions which are p-type impurity ions are implanted into the drift layer 14, using the first mask member as an ion implantation mask. The p well region 16 is formed by the ion implantation.

In Step S104, first, a second mask member is formed by patterning using photolithography and etching. Then, nitrogen ions which are n-type impurity ions are implanted into the drift layer 14, using the second mask member as an ion implantation mask, to form the source region 18.

In Step S106, a third mask member is formed by patterning using photolithography and etching. Then, aluminum ions which are p-type impurity ions are implanted into the drift layer 14, using the third mask member as an ion implantation mask, to form the well contact region 20.

In Step S108, a first annealing process for activating the p-type impurities and the n-type impurities is performed. For example, this annealing process is performed under the conditions of a heating temperature of 1750° C. and a heating time of 30 minutes, using argon (Ar) gas as atmosphere gas.

In Step S110, a phosphorus-doped polysilicon film is deposited on the drift layer 14 and the p well region 16. The phosphorus-doped polysilicon film is a polysilicon film including phosphorus (P) as impurities. The thickness of the phosphorus-doped polysilicon film is, for example, equal to or greater than 2 nm and equal to or less than 5 nm. Instead of the phosphorus-doped polysilicon film, a phosphorus-doped amorphous silicon film may be applied.

The introduction of phosphorus into the polysilicon film is performed at the same time as, for example, the deposition of the film. In addition, after an undoped polysilicon film is deposited, a heat treatment maybe performed for the undoped polysilicon film in an atmosphere including phosphorus to introduce phosphorus into the polysilicon film.

In Step S112, the phosphorus-doped polysilicon film is oxidized while being irradiated with ultraviolet rays. A first silicon oxide film is formed by the oxidation of the phosphorus-doped polysilicon film. The first silicon oxide film is a thermally oxidized film. The thickness of the first silicon oxide film is, for example, equal to or greater than 4 nm and equal to or less than 10 nm.

Similarly to the first silicon oxide film, the interface region 40 in which phosphorus is segregated is formed between the drift layer 14 and the first silicon oxide film and between the p well region 16 and the first silicon oxide film. An interface termination where a phosphorus atom and an oxygen atom that forms a double bond with the phosphorus atom form a termination element is formed in the interface region 40.

Thermal oxidation is performed, for example, in a dry oxygen atmosphere. The thermal oxidation temperature is, for example, equal to or greater than 200° C. and equal to or less than 800° C. The thermal oxidation may be performed in a wet atmosphere.

The energy of the emitted ultraviolet rays is, for example, equal to or greater than 3.0 eV and equal to or less than 4.0 eV.

In Step S114, a second silicon oxide film is deposited on the first silicon oxide film. The silicon oxide film is formed by, for example, a chemical vapor deposition (CVD) method or a physical vapor deposition (PVD) method.

The gate insulating layer 28 is a stacked film of the first silicon oxide film and the second silicon oxide film.

The thickness of the second silicon oxide film is, for example, equal to or greater than 20 nm and equal to or less than 150 nm. For example, the second silicon oxide film is a silicon oxide film which is formed by a CVD method using tetraethyl orthosilicate (TEOS) as source gas.

After the second silicon oxide film is deposited, densification annealing may be performed, for example, in a nitrogen gas atmosphere or an argon gas atmosphere. The second silicon oxide film is changed to a dense film by the densification annealing. The densification annealing temperature is, for example, equal to or greater than 900° C. and equal to or less than 1400° C.

In Step S116, the gate electrode 30 is formed on the insulating layer 29. The gate electrode 30 is made of, for example, polysilicon including n-type impurities or p-type impurities.

In Step S118, the interlayer insulating film 32 is formed on the gate electrode 30. The interlayer insulating film 32 is, for example, a silicon oxide film.

In Step S120, the source electrode 34 is formed. The source electrode 34 is formed on the source region 18 and the well contact region 20. The source electrode 34 is formed by sputtering, for example, nickel (Ni) and aluminum (Al).

In Step S122, the drain electrode 36 is formed. The drain electrode 36 is formed on the rear surface of the silicon carbide substrate 12. The drain electrode 36 is formed by, for example, sputtering nickel.

In Step S124, a second annealing process is performed in order to reduce the contract resistance between the source electrode 34 and the drain electrode 36. For example, the second annealing process is performed in an argon gas atmosphere at a temperature that is equal to or greater than 400° C. and equal to or less than 1000° C.

The MOSFET 100 according to the first embodiment illustrated in FIG. 1 is manufactured by the above-mentioned manufacturing method.

Next, the function and effect of this embodiment will be described.

In the manufacturing method according to this embodiment, the phosphorus-doped polysilicon film is oxidized while being irradiated with ultraviolet rays. In this way, it is possible to form the interface region 40 that includes the termination element including a phosphorus (P) atom and an oxygen (O) which forms a double bond with the phosphorus (P) atom.

Figure 10A:
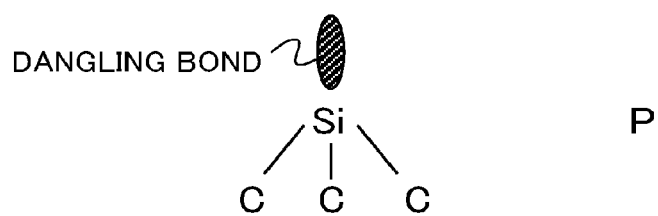
FIGS. 10A, 10B, and 10C are diagrams illustrating the function and effect of the third embodiment.
Figure 10B:
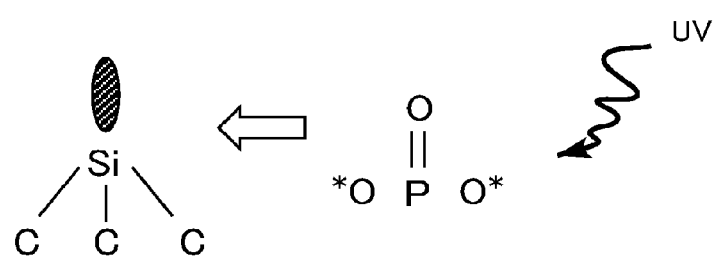
Figure 10C:
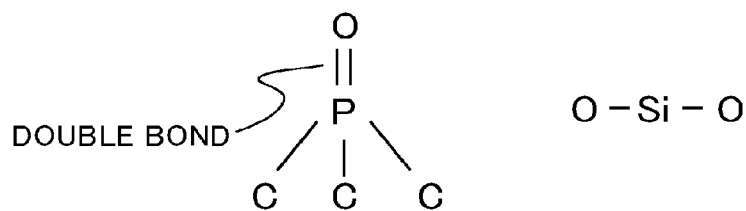

FIGS. 10A, 10B, and 10C are diagrams illustrating the function and effect of this embodiment. In Step S110, the phosphorus-doped polysilicon film is deposited. In this state, as illustrated in FIG. 10A, a silicon atom having a dangling bond is present in the outermost surface of the silicon carbide layer.

In Step S112, the phosphorus-doped polysilicon film is oxidized while being irradiated with ultraviolet rays. At that time, as illustrated in FIG. 10B, the phosphorus atom in the phosphorus-doped polysilicon film is bonded to an oxygen atom in an oxidizing atmosphere to form a $PO_3^-$ radical. $PO_3^-$ is excited by the energy of ultraviolet rays to form the $PO_3^-$ radical.

As illustrated in FIG. 10C, two oxygen atoms in the $PO_3^-$ radical are back-bonded to a silicon atom having a dangling bond to separate the silicon atom from the outermost surface of the silicon carbide layer. A phosphorus atom forming a double bond with an oxygen atom is bonded to the position of the separated silicon atom. The phosphorus atom forming a double bond with the oxygen atom is the termination element. The oxygen atom separated from the $PO_3^-$ radical forms silicon oxide in the thermally oxidized film.

In contrast, when the interface region is formed only by the thermal oxidation of the phosphorus-doped polysilicon film, without emitting ultraviolet rays, excitation energy is insufficient and it is difficult to form the $PO_3^-$ radical. Therefore, the interface region having only the phosphorus atom as the termination element is formed. That is, the termination structure illustrated in FIG. 5C is not formed, but the termination structure illustrated in FIG. 5B is formed. It is necessary to perform oxidation at a high temperature of 1200° C. to 1350° C. in order to form the interface region having only the phosphorus atom as the termination element.

When oxidation is performed at a high temperature of 1200° C. to 1350° C., the silicon carbide layer is also oxidized and the efficiency of termination by the termination element is reduced. Therefore, there is a concern that the mobility of carriers will not be sufficiently improved.

When oxidation is performed at a high temperature of 1200° C. to 1350° C., the silicon carbide layer is oxidized and a large number of carbon defects occur in the silicon carbide layer. Therefore, a large amount of phosphorus in the phosphorus-doped polysilicon film is diffused to the silicon carbide layer. There is a concern that the threshold voltage of the MOSFET will be reduced by phosphorus functioning as n-type impurities.

When oxidation is performed at a high temperature of 1200° C. to 1350° C., a large amount of $PO_4$ with a tetrahedral structure having a phosphorus atom as a central element is formed in the thermally oxidized film. Phosphorus in $PO_4$ emits an electron and becomes a positive fixed charge. Therefore, there is a concern that the threshold voltage of the MOSFET will vary.

According to this embodiment, the $PO_3^-$ radical can be formed with high energy by irradiation with ultraviolet rays. Therefore, the interface region 40 in which a phosphorus atom and an oxygen atom that forms a double bond with the phosphorus atom form the termination element can be formed.

For example, the use of excitation by irradiation with ultraviolet rays makes it possible to form a thermally oxidized film and the interface region 40 at a low temperature that is equal to or greater than 200° C. and equal to or less than 800° C. Therefore, the oxidation of the silicon carbide layer is prevented. As a result, the diffusion of phosphorus into the silicon carbide layer is prevented. In addition, since the termination element is excited by irradiation with ultraviolet rays, the efficiency of termination by the termination element is improved. It is preferable that the thermally oxidized film and the interface region 40 be formed at a temperature that is equal to or greater than 600° C. and equal to or less than 700° C.

The $PO_3^-$ radical formed by irradiation with ultraviolet rays is used. The $PO_3^-$ radical has a larger size than elemental phosphorus. Therefore, the diffusion of phosphorus into the silicon carbide layer is less than that when only phosphorus is used as the termination element.

Since the $PO_3^-$ radical formed by irradiation with ultraviolet rays is used, termination efficiency is improved. Therefore, the amount of phosphorus remaining in the thermally oxidized film is reduced and the formation of $PO_4$ in the thermally oxidized film is prevented. As a result, a variation in the threshold voltage of the MOSFET is prevented.

In this embodiment, an example in which the element including the first atom is phosphorus (P) has been described. However, the element including the first atom may be nitrogen (N), arsenic (As), antimony (Sb), or bismuth (Bi). In this case, atoms introduced into the polysilicon film are changed to manufacture the same MOSFET as that when the element is phosphorus (P).

For example, phosphorus (P), nitrogen (N), arsenic (As), antimony (Sb), or bismuth (Bi) which will be the element including the first atom can be introduced using gases represented by the following chemical formulas: NO, $N_2O$, $NO_2$, $NH_3$, $ND_3$, $NF_3$, $NH_2$, $ND_2$, $NF_2$, $NOH_3$, $NOCl_3$, $NOF_3$, PO, $P_2O$, $PO_2$, $P_2O_5$, $PH_3$, $PD_3$, $PF_3$, $PH_2$, $PD_2$, $PF_2$, $POH_3$, $POCl_3$, $POF_3$, AsO, $As_2O$, $AsO_2$, $As_2O_5$, $AsH_3$, $AsD_3$, $AsF_3$, $AsH_2$, $AsD_2$, $AsF_2$, $AsOH_3$, $AsOCl_3$, $AsOF_3$, SbO, $Sb_2O$, $SbO_2$, $Sb_2O_5$, $SbH_3$, $SbD_3$, $SbF_3$, $SbH_2$, $SbD_2$, $SbF_2$, $SbOH_3$, $SbOCl_3$, $SbOF_3$, BiO, $Bi_2O$, $BiO_2$, $Bi_2O_5$, $BiH_3$, $BiD_3$, $BiF_3$, $BiH_2$, $BiD_2$, $BiF_2$, $BiOH_3$, $BiOCl_3$, and $BiOF_3$. The above-mentioned gases may be mixed with each other and then used.

In this embodiment, an example in which the element including the second atom is oxygen (O) has been described. However, the element including the second atom may be sulfur (S) selenium (Se), or tellurium (Te). For example, during oxidation, gas including sulfur (S), selenium (Se), or tellurium (Te) can flow to form a termination element including sulfur (S), selenium (Se), or tellurium (Te).

For example, oxygen (O), sulfur (S), selenium (Se), or tellurium (Te) which will be the element including the second atom can be introduced using gases represented by the following chemical formulas: $O_2$, $S_2$, $Se_2$, and $Te_2$. The above-mentioned gases may be mixed with each other and then used.

It is preferable that the energy of the emitted ultraviolet rays be equal to or greater than 3.0 eV and equal to or less than 4.0 eV. When the energy is lower than the above-mentioned range, there is a concern that the termination of the interface by the termination element including the first atom and the second atom will not be achieved. When the energy is higher than the above-mentioned range, there is a concern that the damage of the silicon carbide layer will increase and the characteristics of the MOSFET 100 will deteriorate.

As described above, according to this embodiment, it is possible to manufacture the MOSFET 100 in which the mobility of carriers is improved. In addition, it is possible to manufacture the MOSFET 100 with high reliability.

In this embodiment, an example of the method which irradiates the silicon carbide layer with ultraviolet rays while supplying the second atom of one element selected from the group consisting of oxygen (O), sulfur (S), selenium (Se), and tellurium (Te) to form the first silicon oxide film on the silicon carbide layer has been described. That is, an example in which the MOSFET having interface termination in which the first atom is four-fold coordinated is manufactured has been described.

In addition, a method which irradiates the silicon carbide layer with ultraviolet rays while supplying the second atom of one element selected from the group consisting of hydrogen (H) and fluorine (F), deuterium (D), or a hydroxyl group (OH) to form the first silicon oxide film on the silicon carbide layer may be used. In this case, it is possible to manufacture the MOSFET having interface termination in which the first atom is five-fold coordinated as described in the second embodiment.

In this case, during oxidation, gas including the second atom of one element selected from the group consisting of hydrogen (H) and fluorine (F), deuterium (D), or a hydroxyl group (OH) can flow to form a termination element including the second atom of one element selected from the group consisting of hydrogen (H) and fluorine (F), deuterium (D), or a hydroxyl group (OH).

The first embodiment has the four-fold coordination structure in which the first atom is substituted with an element in the outermost surface of the silicon carbide layer and the second atom is bonded to the first atom. In the related art, it is difficult to manufacture the special four-fold coordination structure. However, in the manufacturing method according to this embodiment, it is possible to change 90% or more, preferably, 95% or more of the termination structure of the interface to the four-fold coordination structure.

Fourth Embodiment

A semiconductor device manufacturing method according to this embodiment includes, forming a silicon oxide film on a silicon carbide layer while supplying a plurality of first atoms of one element selected from the group consisting of nitrogen (N), phosphorus (P), arsenic (As), antimony (Sb), and bismuth (Bi) to the silicon carbide layer; and irradiating the silicon oxide film with ultraviolet rays while supplying at least one of a plurality of second atoms of one element selected from the group consisting of hydrogen (H) and fluorine (F), a plurality of deuterium (D) atoms, and a plurality of hydroxyl groups (OH) to the silicon oxide film.

The manufacturing method according to this embodiment is a method for manufacturing the MOSFET according to the second embodiment.

Figure 11:
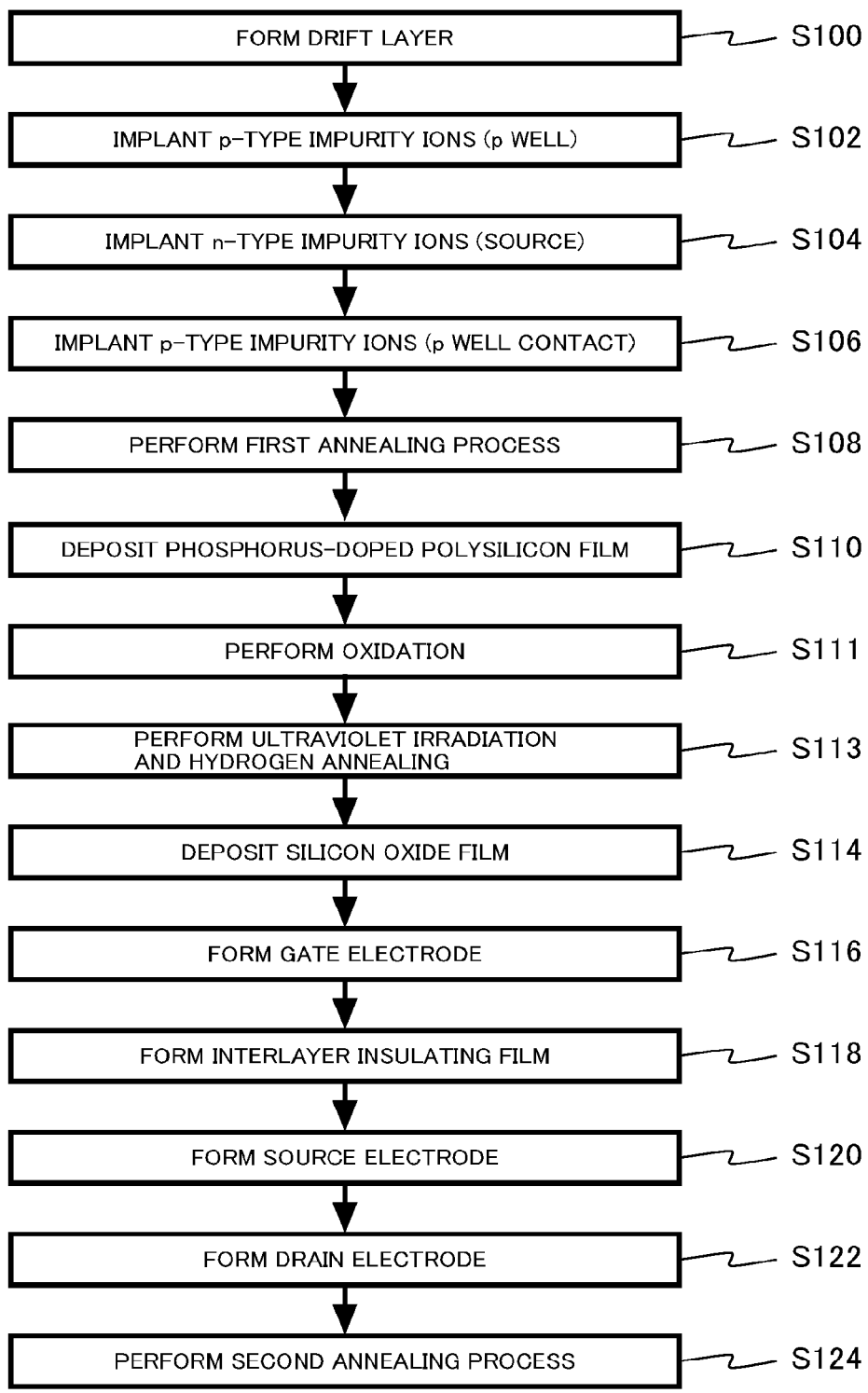
FIG. 11 is a process flowchart illustrating a semiconductor device manufacturing method according to a fourth embodiment.

FIG. 11 is a process flowchart illustrating the semiconductor device manufacturing method according to this embodiment.

As illustrated in FIG. 11, the semiconductor device manufacturing method includes a drift layer forming step (Step S100), a p-type impurity ion implantation step (Step S102), a n-type impurity ion implantation step (Step S104), a p-type impurity ion implantation step (Step S106), a first annealing step (Step S108), a phosphorus-doped polysilicon film forming step (Step S110), an oxidation step (Step S111), an ultraviolet irradiation and hydrogen annealing step (Step S113), a silicon oxide film deposition step (Step S114), a gate electrode forming step (Step S116), an interlayer insulating film forming step (Step S118), a source electrode forming step (Step S120), a drain electrode forming step (Step S122), and a second annealing step (Step S124).

Steps from the drift layer forming step (Step S100) to the phosphorus-doped polysilicon film forming step (Step S110) are the same as those in the third embodiment. Therefore, the description of the same content as that in the third embodiment will not be repeated.

In Step S111, the phosphorus-doped polysilicon film is thermally oxidized. A first silicon oxide film is formed by the oxidation of the phosphorus-doped polysilicon film. The thickness of the first silicon oxide film is, for example, equal to or greater than 4 nm and equal to or less than 10 nm.

At the same time, the interface region 40 in which phosphorus is segregated is formed between the drift layer 14 and the first silicon oxide film and between the p well region 16 and the first silicon oxide film. Interface termination in which only a phosphorus atom is a termination element is formed in the interface region 40.

Thermal oxidation is performed in, for example, a dry oxygen atmosphere. The thermal oxidation temperature is, for example, equal to or greater than 1200° C. and equal to or less than 1350° C. The thermal oxidation may be performed in a wet atmosphere.

In Step S111, a heat treatment is performed in an atmosphere including a hydrogen atom while ultraviolet rays are emitted. For example, hydrogen annealing is performed while ultraviolet rays are emitted. Two hydrogen atoms are bonded to a phosphorus atom in the interface region 40 by the heat treatment and interface termination in which a phosphorus atom and two hydrogen atoms bonded to the phosphorus atom form the termination element is formed.

The energy of the emitted ultraviolet rays is, for example, equal to or greater than 3.0 eV and equal to or less than 4.0 eV.

Steps from the silicon oxide film deposition step (Step S114) to the second annealing step (Step S124) are the same as those in the third embodiment. Therefore, the description of the same content as that in the third embodiment will not be repeated.

The MOSFET according to the second embodiment is manufactured by the above-mentioned manufacturing method.

Next, the function and effect of this embodiment will be described.

Figure 12A:
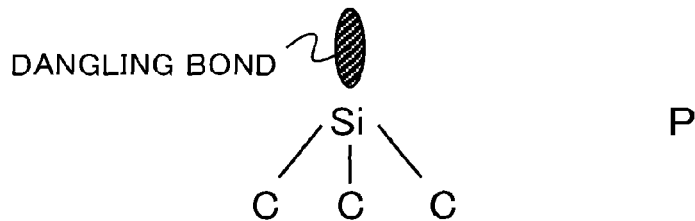
FIGS. 12A, 12B, 12C, and 12D are diagrams illustrating the function and effect of the fourth embodiment.

FIGS. 12A, 12B, 12C, and 12D are diagrams illustrating the function and effect of this embodiment. In Step S110, the phosphorus-doped polysilicon film is deposited. In this state, as illustrated in FIG. 12A, a silicon atom having a dangling bond is present in the outermost surface of the silicon carbide layer.

Figure 12B:
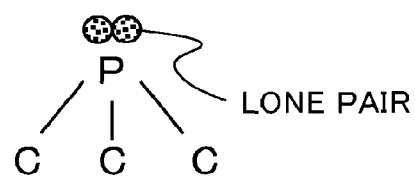

In Step S111, the phosphorus-doped polysilicon film is thermally oxidized. At that time, as illustrated in FIG. 12B, a phosphorus atom in the phosphorus-doped polysilicon film substitutes the silicon atom having a dangling bond. Interface termination having the phosphorus atom as the termination element is formed.

Figure 12C:
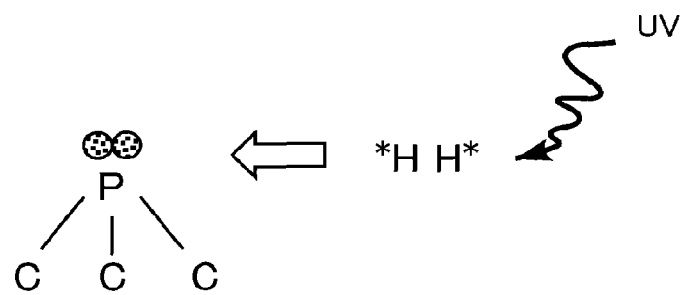

In Step S113, hydrogen annealing is performed while ultraviolet rays are emitted. As illustrated in FIG. 12C, a hydrogen molecule is excited by the energy of the ultraviolet rays to form a hydrogen radical.

Figure 12D:
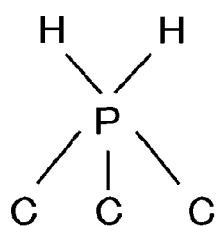

The excited hydrogen radical is bonded to the phosphorus atom. Then, as illustrated in FIG. 12D, a phosphorus atom and two hydrogen atoms bonded to the phosphorus atom form a termination element.

According to this embodiment, a hydrogen radical can be formed by the energy of the emitted ultraviolet rays. Therefore, it is possible to form the interface region 40 in which a phosphorus atom and two hydrogen atoms bonded to the phosphorus atom form the termination element.

In contrast, when only annealing is performed in a hydrogen atmosphere without emitting ultraviolet rays, a hydrogen molecule is not excited and it is difficult to bond a hydrogen atom to a phosphorus atom. Therefore, a five-fold coordinated termination structure is not formed. That is, the termination structure illustrated in FIG. 12D is not obtained and the termination structure illustrated in FIG. 12B remains.

In this embodiment, the termination structure illustrated in FIG. 12B is efficiently formed by the excitation of neighboring phosphorus atoms by irradiation with ultraviolet rays. That is, the amount of phosphorus which is useful as the termination element increases, which results in an increase in the termination efficiency of a MOS interface. A hydrogen atom is bonded to the phosphorus atom. As a result, the termination structure illustrated in FIG. 12D is obtained.

In this embodiment, an example in which the element including the first atom is phosphorus (P) has been described. However, the element including the first atom may be nitrogen (N), arsenic (As), antimony (Sb), or bismuth (Bi). In this case, atoms introduced into the polysilicon film can be changed to manufacture the same MOSFET as that when the element is phosphorus (P).

In addition, an example in which the element including the second atom is hydrogen (H) has been described. However, the element including the second atom may be fluorine (F). For example, instead of the hydrogen annealing, a heat treatment may be performed in a gas atmosphere including fluorine (F) while ultraviolet rays are emitted to form a termination element including fluorine (F).

Instead of the second atom, deuterium (D) may be used. For example, a heat treatment can be performed in a deuterium gas atmosphere while ultraviolet rays are emitted to form a termination element including deuterium (D).

Instead of the second atom, a hydroxyl group (OH) may be used. For example, a heat treatment can be performed in a vapor ($H_2O$) atmosphere while ultraviolet rays are emitted to form a termination element including a hydroxyl group (OH).

It is preferable that the energy of the emitted ultraviolet rays be equal to or greater than 3.0 eV and equal to or less than 4.0 eV. When the energy is lower than the above-mentioned range, there is a concern that termination of the interface by the termination element including the second atom, deuterium, or a hydroxyl group will not be achieved. When the energy is higher than the above-mentioned range, there is a concern that the damage of the silicon carbide layer will increase and the characteristics of the MOSFET will deteriorate.

In Step S111, when the first silicon oxide film is formed, oxidation is performed preferably at a low temperature that is equal to or greater than 200° C. and equal to or less than 700° C. and more preferably at a low temperature that is equal to or greater than 600° C. and equal to or less than 700° C., while ultraviolet rays are emitted. In this case, it is possible to improve termination efficiency. In addition, it is possible to prevent a variation in the threshold voltage of the MOSFET.

As described above, according to this embodiment, it is possible to manufacture a MOSFET in which the mobility of carriers is improved. In addition, it is possible to manufacture a MOSFET with high reliability.

In this embodiment, an example of the method which emits ultraviolet rays while supplying the second atom of one element selected from the group consisting of hydrogen (H) and fluorine (F), deuterium (D), or a hydroxyl group (OH) to bond the second atom, the deuterium (D), or the hydroxyl group (OH) to the first atom has been described. That is, an example in which the MOSFET having interface termination in which the first atom is five-fold coordinated is manufactured has been described.

In addition, a method which emits ultraviolet rays while supplying the second atom of one element selected from the group consisting of oxygen (O), sulfur (S), selenium (Se), and tellurium (Te) to bond the second atom to the first atom may be used. In this case, it is possible to manufacture the MOSFET having interface termination in which the first atom is four-fold coordinated as described in the first embodiment.

The second embodiment has the five-fold coordination structure in which the first atom is substituted with an element in the outermost surface of the silicon carbide layer and the second atom is bonded to the first atom. In the related art, it is difficult to manufacture the special five-fold coordination structure. However, in the manufacturing method according to this embodiment, it is possible to change 90% or more, preferably, 95% or more of the termination structure of the interface to the five-fold coordination structure.

Fifth Embodiment

A semiconductor device according to this embodiment differs from the semiconductor device according to the first embodiment in that an interface region is provided in a termination region of the MOSFET. The description of the same content as that in the first embodiment will not be repeated.

Figure 13:
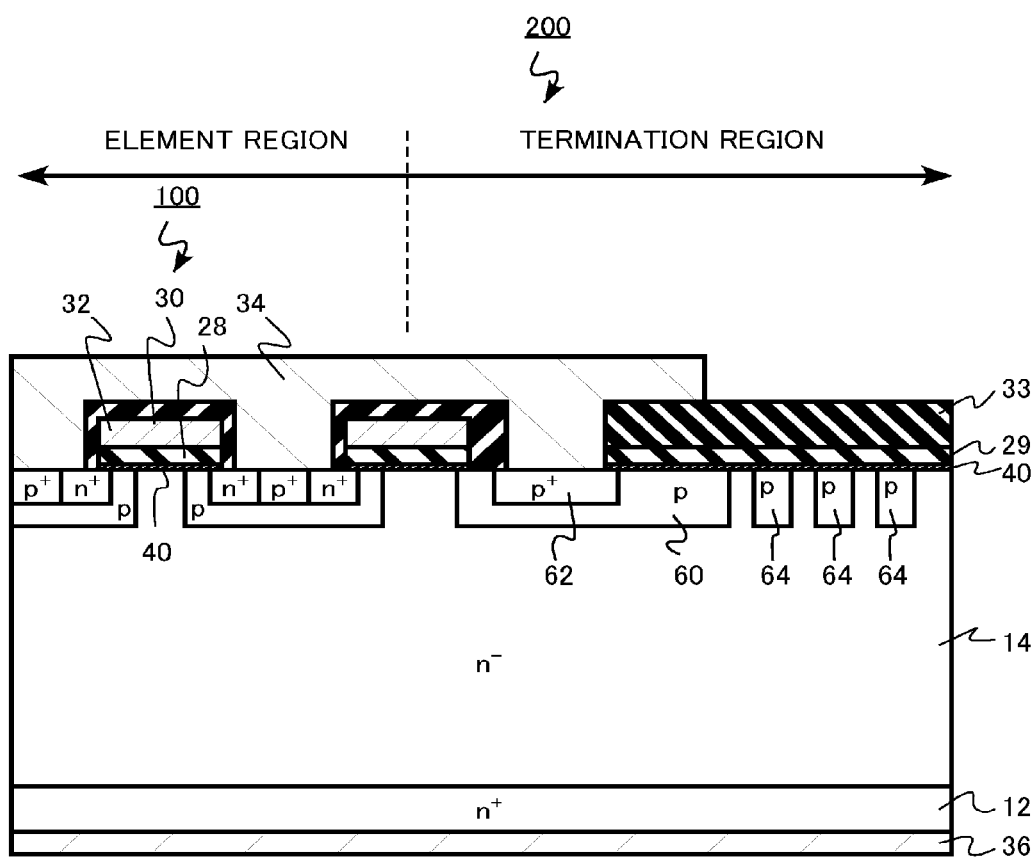
FIG. 13 is a cross-sectional view schematically illustrating a semiconductor device according to a fifth embodiment.

FIG. 13 is a cross-sectional view schematically illustrating the structure of a MOSFET which is the semiconductor device according to this embodiment. A MOSFET 200 includes an element region and a termination region that is provided around the element region. The termination region has a function of improving the breakdown voltage of the MOSFET 200.

For example, the MOSFET 100 according to the first embodiment is provided as a unit cell in the element region.

The termination region includes a p-type RESURF region (silicon carbide layer) 60, a p+ contact region 62, a p-type guard ring region (silicon carbide layer) 64, an interface region 40, a gate insulating layer 28, an insulating layer 29, and a field oxide film 33. The interface region 40 is provided between a surface of the p-type RESURF region 60 and the field oxide film 33 and between a surface of the p-type guard ring region 64 and the field oxide film 33.

The gate insulating layer 28 and the interface region 40 have the same structure as those in the first embodiment. For example, the gate insulating layer 28 and the insulating layer 29 are formed at the same time. The gate insulating layer 28 and the insulating layer 29 have the same structure.

The field oxide film 33 is, for example, a silicon oxide film.

When the MOSFET 200 is turned off, a depletion layer is formed in the RESURF region 60, the guard ring regions 64, and a portion of the drift layer (silicon carbide layer) 14 between the guard ring regions 64 and the breakdown voltage of the MOSFET 200 is improved.

However, when there is an interface state at the interface between the RESURF region 60 and the insulating layer 29 and the interface between the guard ring region 64 and the insulating layer 29 or in the insulating layer 29, charge is trapped in the interface state. There is a concern that a desired depletion layer will not be formed by the electric field of the trapped charge. In this case, the breakdown voltage of the MOSFET 200 is reduced.

According to this embodiment, since the interface region 40 is provided, the interface state is stably terminated by the termination element. Therefore, a desired depletion layer is formed and the MOSFET 200 with a stable breakdown voltage is achieved.

Sixth Embodiment

An inverter circuit and a driving device according to this embodiment includes the semiconductor device according to the first embodiment.

Figure 14:
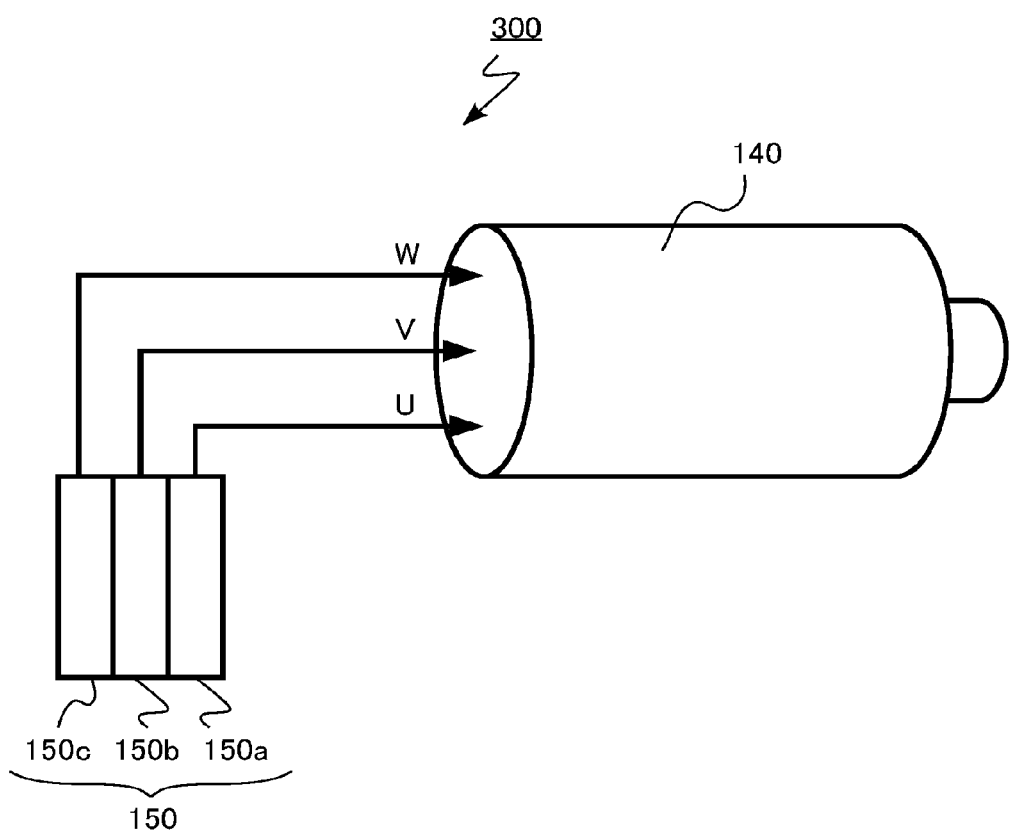
FIG. 14 is a diagram schematically illustrating a driving device according to a sixth embodiment.

FIG. 14 is a diagram schematically illustrating the driving device according to this embodiment. A driving device 300 includes a motor 140 and an inverter circuit 150.

The inverter circuit 150 includes three semiconductor modules 150a, 150b, and 150c having the MOSFET 100 according to the first embodiment as a switching element. The three semiconductor modules 150a, 150b, and 150c are connected in parallel to each other to form the three-phase inverter circuit 150 including three AC voltage output terminals U, V, and W. The motor 140 is drive by an AC voltage which is output from the inverter circuit 150.

According to this embodiment, since the inverter circuit includes the MOSFET 100 with improved characteristics, the characteristics of the inverter circuit 150 and the driving device 300 are improved.

Seventh Embodiment

A vehicle according to this embodiment includes the semiconductor device according to the first embodiment.

Figure 15:
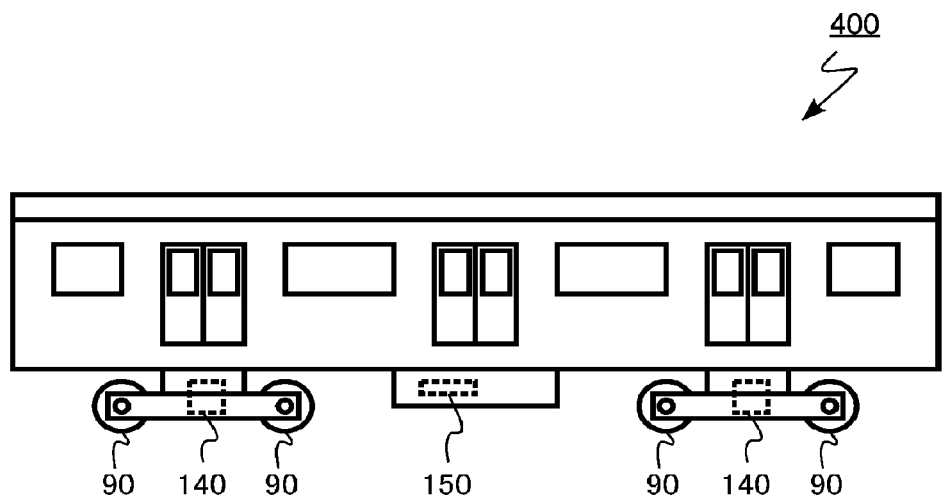
FIG. 15 is a diagram schematically illustrating a vehicle according to a seventh embodiment.

FIG. 15 is a diagram schematically illustrating the vehicle according to this embodiment. A vehicle 400 according to this embodiment is a railway vehicle. The vehicle 400 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W. The motor 140 is driven by an AC voltage which is output from the inverter circuit 150. Wheels 90 of the vehicle 400 are rotated by the motor 140.

According to this embodiment, since the vehicle 400 includes the MOSFET 100 with improved characteristics, the characteristics of the vehicle 400 are improved.

Eighth Embodiment

A vehicle according to this embodiment includes the semiconductor device according to the fifth embodiment.

Figure 16:
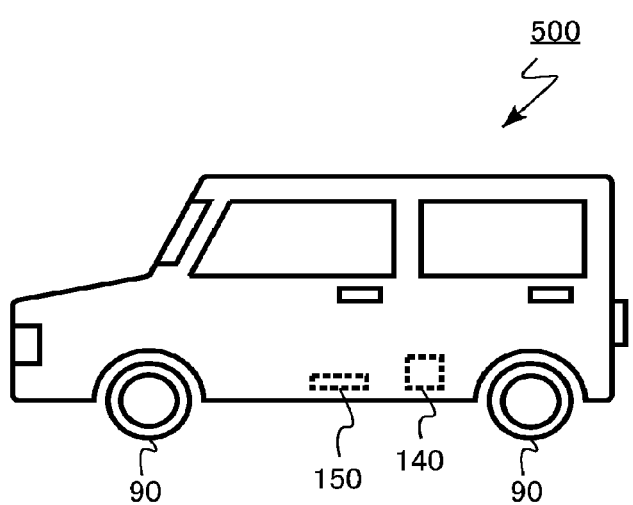
FIG. 16 is a diagram schematically illustrating a vehicle according to an eighth embodiment.

FIG. 16 is a diagram schematically illustrating the vehicle according to this embodiment. A vehicle 500 according to this embodiment is a car. The vehicle 500 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. Wheels 90 of the vehicle 500 are rotated by the motor 140.

According to this embodiment, since the vehicle 500 includes the MOSFET 100 with improved characteristics, the characteristics of the vehicle 500 are improved.

Ninth Embodiment

An elevator according to this embodiment includes the semiconductor device according to the first embodiment.

Figure 17:
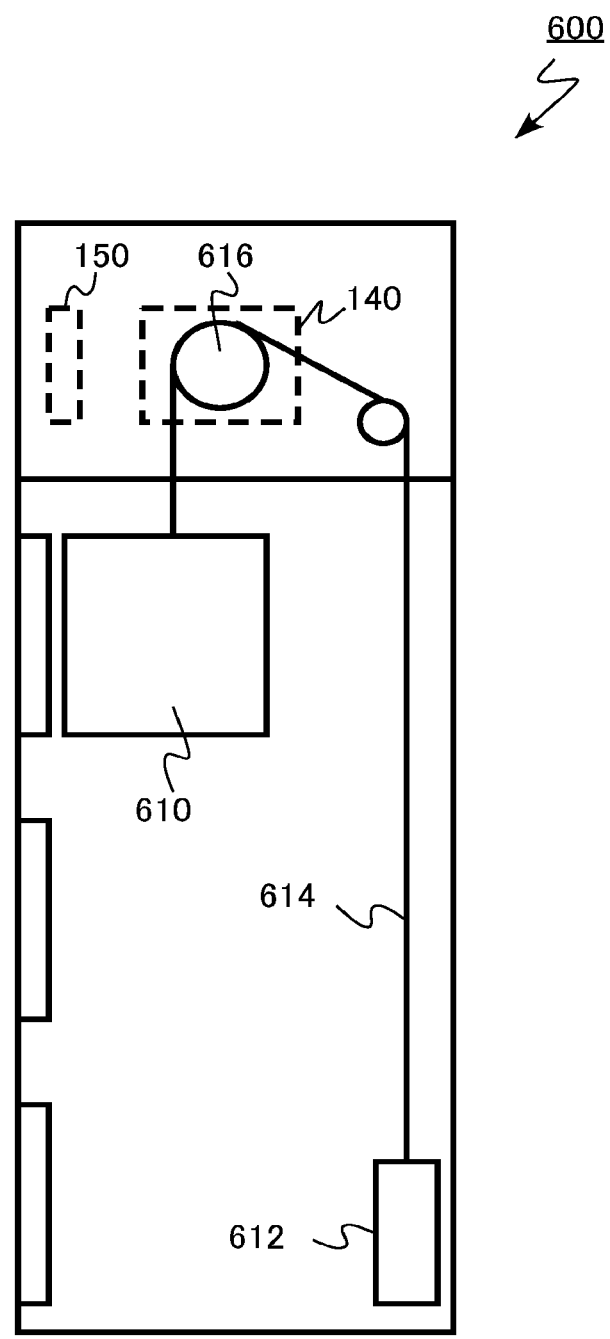
FIG. 17 is a diagram schematically illustrating an elevator according to a ninth embodiment.

FIG. 17 is a diagram schematically illustrating the elevator according to this embodiment. An elevator 600 according to this embodiment includes a basket 610, a counter weight 612, a wire rope 614, a hoist 616, a motor 140, and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. The hoist 616 is rotated by the motor 140 to move up and down the basket 610.

According to this embodiment, since the elevator 600 includes the MOSFET 100 with improved characteristics, the characteristics of the elevator 600 are improved.

In the first embodiment, a case in which the interface region 40 includes the four-fold coordinated first atom has been described. In the second embodiment, a case in which the interface region 40 includes the five-fold coordinated first atom has been described. However, the interface region 40 may include both the four-fold coordinated first atom and the five-fold coordinated first atom.

In the first and second embodiments, an example in which the crystal structure of silicon carbide is 4H-SiC has been described. However, the invention can be applied to silicon carbide with other crystal structures such as 6H-SiC and 3C-SiC.

In the first and second embodiments, an example in which the gate insulating layer 28 is provided on the silicon face of silicon carbide has been described. However, the invention may be applied to a case in which the gate insulating layer 28 is provided on other faces of silicon carbide, such as a carbon face, an a-face, an m-face, and a (0-33-8) face.

In the first and second embodiment, the n-channel planar MOSFET is given as an example. However, the invention may be applied to an n-channel trench MOSFET. The typical example of the side face of the trench is an a-face, an m-face, or a (0-33-8) face. The a-face and the m-face are perpendicular to the Si face and the C face. The (0-33-8) face is inclined at an angle of 54.7° with respect to the (0001) face in a <1-100> direction. This crystal face orientation is a crystal face corresponding to Si(001) in the Si crystal.

The invention may be applied to an n-channel insulated gate bipolar transistor (IGBT).

The invention is not limited to the n-channel type and may be applied to a p-channel MOSFET or IGBT.

In the seventh to ninth embodiments, an example in which the semiconductor device according to this invention is applied to the vehicle or the elevator has been described. However, the semiconductor device according to this invention may be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a silicon carbide layer;
    an insulating layer; and
    a region provided between the silicon carbide layer and the insulating layer, the region including a plurality of first atoms of one element from the group consisting of nitrogen (N), phosphorus (P), arsenic (As), antimony (Sb), and bismuth (Bi), at least some of the plurality of first atoms being four-fold coordinated atoms and/or five-fold coordinated atoms.

2. The semiconductor device according to claim 1, wherein the number of the some of the plurality of first atoms is greater than the number of three-fold coordinated atoms included in the plurality of first atoms.

3. The semiconductor device according to claim 1, wherein a ratio of the number of the some of the plurality of first atoms to the number of the plurality of first atoms is 90% or more.

4. The semiconductor device according to claim 1, wherein a first peak of a concentration distribution of the plurality of first atoms is present in the region.

5. The semiconductor device according to claim 1, wherein a first peak of a concentration distribution of the plurality of first atoms is equal to or greater than $1 \times 10^{18}$ cm$^{-3}$ and equal to or less than $1 \times 10^{20}$ cm$^{-3}$.

6. The semiconductor device according to claim 4, wherein a full width at half maximum of the concentration distribution of the plurality of first atoms at the first peak is equal to or less than 2 nm.

7. The semiconductor device according to claim 1, wherein the region includes at least one of a plurality of second atoms, a plurality of deuterium (D) atoms, and a plurality of hydroxyl groups (OH), the second atoms being one element from the group consisting of oxygen (O), sulfur (S), selenium (Se), tellurium (Te), hydrogen (H), and fluorine (F).

8. The semiconductor device according to claim 7, wherein the at least one of the plurality of second atoms, the plurality of deuterium atoms, and the plurality of hydroxyl groups is chemically bonded to the some of the plurality of first atoms.

9. The semiconductor device according to claim 7, wherein a second peak of a concentration distribution of the at least one of the plurality of second atoms, the plurality of deuterium atoms, and the plurality of hydroxyl groups is present in the region.

10. The semiconductor device according to claim 7, wherein a second peak of a concentration distribution of the at least one of the plurality of second atoms, the plurality of deuterium atoms, and the plurality of hydroxyl groups is equal to or greater than $1\times10^{18}$ cm$^{-3}$ and equal to or less than $1\times10^{2}$ cm$^{-3}$.

11. The semiconductor device according to claim 9, wherein a full width at half maximum of the concentration distribution of the at least one of the plurality of second atoms, the plurality of deuterium atoms, and the plurality of hydroxyl groups at the second peak is equal to or less than 2 nm.

12. The semiconductor device according to claim 1, further comprising:
a gate electrode, the insulating layer being interposed between the silicon carbide layer and the gate electrode.

13. The semiconductor device according to claim 1, wherein the insulating layer includes silicon oxide.

14. An inverter circuit comprising:
the semiconductor device according to claim 1.

15. A driving device comprising:
the semiconductor device according to claim 1.

16. A vehicle comprising:
the semiconductor device according to claim 1.

17. An elevator comprising:
the semiconductor device according to claim 1.

* * * * *